United States Patent [19]

Pender

[11] Patent Number: 4,724,856
[45] Date of Patent: Feb. 16, 1988

[54] DYNAMIC FLOOD CONVEYOR

[76] Inventor: Don P. Pender, 1121 E. Wesleyan Dr., Tempe, Ariz. 85282

[21] Appl. No.: 840,069

[22] Filed: Mar. 17, 1986

[51] Int. Cl.⁴ .......................... B08B 3/00; B05C 3/02
[52] U.S. Cl. .............................. 134/122 R; 134/122 P; 118/405; 68/22 B
[58] Field of Search ............ 134/122 R, 122 P, 64 R, 134/64 P; 68/207, 43, 158, 175, 22 B; 118/405, 419, 429

[56] References Cited

U.S. PATENT DOCUMENTS 2,781,655  2/1957  Brown .................................. 68/22 B
3,057,282 10/1962  Luboshez ........................ 68/22 B X
3,881,445  5/1975  Nothiger .......................... 118/405 X
3,885,581  5/1975  Dahan et al. ................... 134/122 R
4,166,688  9/1979  Sachs .......................... 134/122 P X Primary Examiner—Louis K. Rimrodt
Assistant Examiner—J. L. Olds
Attorney, Agent, or Firm—Nissle & Leeds

[57] ABSTRACT

Dynamic flood conveyor. The conveyor permits a chemical solution to be applied to the surface of a material such that the solution interacts with the material at a generally uniform rate at each point on the surface of the material. The apparatus promotes laminar flow of the chemical solution over the surface of the material.

1 Claim, 4 Drawing Figures

DYNAMIC FLOOD CONVEYOR

This invention relates to apparatus for applying chemical solutions to the surface of a piece of material.

More particularly, the invention relates to apparatus which permits a chemical solution to be applied to the surface of a material such that the solution interacts with the material at a generally uniform rate at each point on the surface of the material.

In a further respect, the invention relates to apparatus which permits a strip of circuit board substrate being transported by a conventional conveyor system to be totally immersed in a chemical bath.

In still another respect, the invention relates to apparatus which promotes laminar flow of a chemical solution along the surface of a strip of circuit board substrate and which minimizes the formation in the solution of eddy currents which can prevent the successful transport of thin substrate strips.

In yet another respect, the invention relates to apparatus which facilitates the treatment of circuit board substrates with solutions containing a high quantity of surfactants.

A wide variety of apparatus is utilized to apply etchants and other chemical solutions to the surfaces of circuit board substrates. Such apparatus is generally designed with the objective of applying a chemical solution to the surface of a circuit board substrate such that the etching, coating or other interaction of the solution with the substrate occurs at a uniform rate at each point on the surface of the substrate. Achieving this objective is difficult, particularly with apparatus which contacts substrates with spray solutions. Spray solutions usually initially contact limited areas of a substrate, causing increased chemical reaction rates in such areas. Further, solutions applied as a spray tend to puddle or accumulate at selected points on a substrate, accelerating or, in some cases, slowing the chemical interaction of the solution with the substrate. Another disadvantage associated with the spray application of solutions is that the velocity of travel of a solution over a substrate will vary by substantial amounts at different points on the substrate surfaces, again resulting in different interaction rates between the substrate and chemical solution. Finally, many prior art substrate spray systems cannot, practically speaking, readily interface and be integrated with conventional conveyor systems to permit the uniform application of a chemical solution to both sides of a horizontally oriented substrate strip.

Accordingly, it would be highly desirable to provide improved apparatus which would facilitate the uniform interaction of a solution with a substrate surface by causing equivalent amounts of a solution to contact each point on the substrate surfaces, by minimizing turbulence in the solution, and by causing the solution to move over the substrate surface at a generally uniform rate.

It would also be highly desirable to provide improved substrate treatment apparatus which could be readily integrated with a conventional system for conveying a horizontally oriented substrate strip.

Therefore, it is a principal object of the invention to provide improved apparatus for contacting the surfaces of a material with a chemical solution.

A further object of the invention is to provide improved apparatus which facilitates the uniform chemical interaction of a solution at all points on the surface of a piece of material.

Another object of the invention is to provide apparatus which promotes the uniform flow of a chemical solution over the surface of a substrate and minimizes the formation in the chemical solution of turbulent currents which cause differing rates of interaction between the solution and substrate.

Still a further object of the instant invention is to provide improved apparatus which can be readily integrated in a conventional conveyor system for transporting horizontally oriented circuit board substrates and which permits the substrate to be totally immersed in a bath of chemical solution used in processing the substrate.

These and other, further and more specific objects and advantages of the invention will be apparent to those skilled in the art from the following detailed description thereof, taken in conjunction with the drawings, in which.

Briefly, in accordance with the invention, I provide a dynamic flood conveyor. The flood conveyor includes a pair of upstanding spaced apart side walls; a plurality of generally horizontally oriented adjacent parallel support rollers each spanning the space between the side walls, having first and second ends each rotatably mounted on one of the side walls, and having a cylindrical outer surface, the uppermost portions of the cylindrical surfaces of the rollers each generally lying in and defining a common imaginary plane, the plurality of rollers including a pair of end rollers; means for rotating each of the support rollers in a common direction; at least one lower fluid containment roller sealingly interposed between and continuously contacting and rotating on top of and intermediate the cylindrical surfaces of each adjacent pair of support rollers, and rotating in a direction opposite the common direction of rotation of the support rollers; a pair of upper fluid containment rollers each spanning the space between the side walls, having a pair of ends each rotatably mounted on one of the side walls, and positioned above and generally parallel to one of the end rollers and continuously contacting at least one of the pair comprising the cylindrical outer surface of one of the end rollers and a piece of material passing between the upper fluid containment roller and the support roller; washer means sealingly interposed between the ends of each of the support and fluid containment rollers and one of the side surfaces; and, a reservoir of fluid in the flood conveyor. The fluid reservoir is generally above the support rollers and the lower fluid containment roller, between the upper fluid containment rollers, and extends above the imaginary plane. The dynamic flood conveyor can include nozzle means positioned beneath the surface of the fluid reservoir to inject fluid into the reservoir in a direction of travel generally parallel to the imaginary plane.

Figure 1:
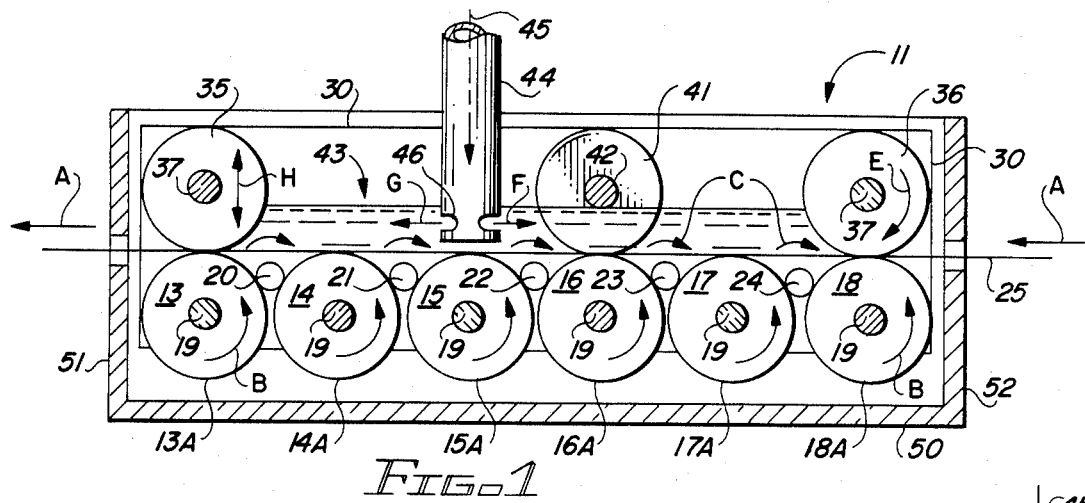
FIG. 1 is a front schematic view of substrate processing apparatus constructed in accordance with the principles of the invention.
Figure 2:
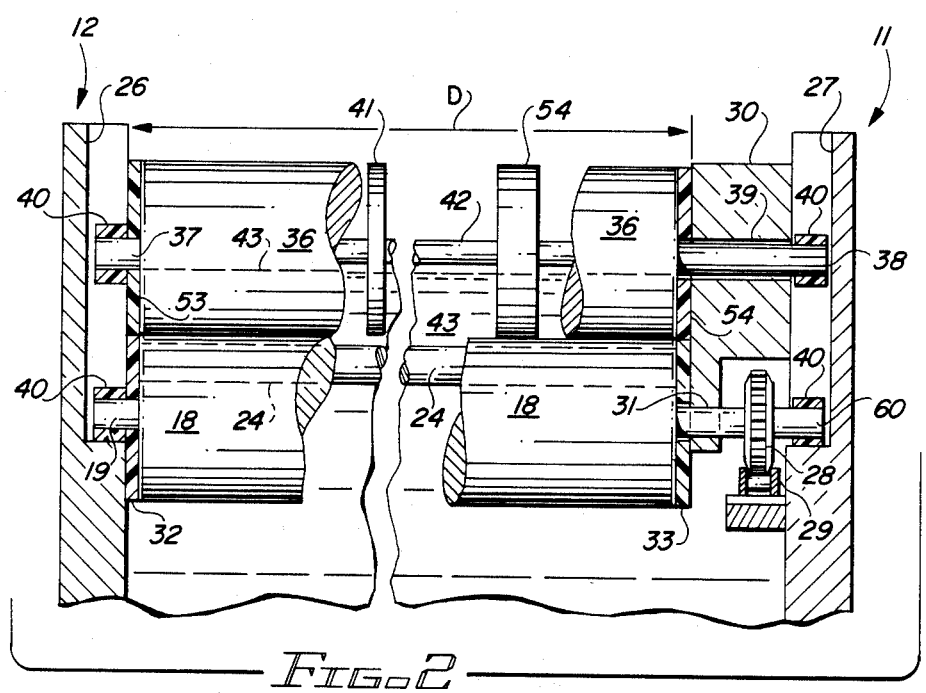
FIG. 2 is an end view of the apparatus of FIG. 1 with a portion thereof broken away to further illustrate interior construction details thereof.
Figure 3:
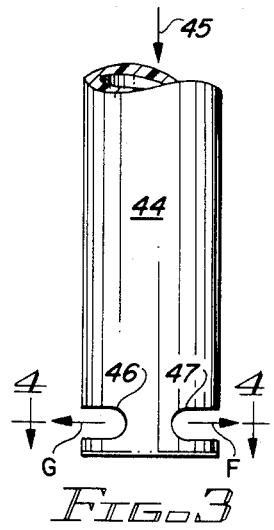
FIG. 3 is a front view illustrating a laminar flow nozzle in the apparatus of FIG. 1; and, FIG. 4 is a section view of the nozzle of FIG. 3 further illustrating interior construction details thereof.
Figure 4:
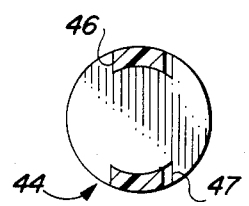

Turning now to the drawings, which depict the presently preferred embodiments of the invention for the purpose of illustrating the practice thereof and not by way of limitation of the scope of the invention, and in which like reference characters represent corresponding elements throughout the several views, FIGS. 1 and 2 illustrate a dynamic flood conveyor constructed in accordance with the principles of the invention and including upstanding side walls 11 and 12 and parallel support rollers 13–18 each having first 19 and second 60 ends rotatably mounted in one of side walls 11 and 12. Rollers 13 and 18 are the end rollers. The diameter of each roller 13–18 presently preferably equals that of the other rollers 13–18. Each roller 13–18 has a cylindrical outer surface 13A–18A. Rollers 13–18 support and transport a strip of material 25 through the dynamic flood conveyor in the direction of arrow A. Rollers 13–18 each turn in the direction indicated by arrows B. The ends 19 of each adjacent pair of support rollers 13–18 are presently equally spaced apart. Each end 19 is rotatably positioned in one of a series of parallel, vertical, spaced apart retainer slots 26 formed in wall 12. The width of a slot 26 is uniform along its length and is slightly greater than the outer diameter of a bushing 40 on an end 19. Similarly, each end 60 is rotatably positioned in one of a series of parallel, vertical, spaced apart retainer slots 27 formed in wall 11. The width of a slot 27 is uniform along its length and is slightly greater than the outer diameter of a bushing 40 on an end 60. End 60 of each roller 13–18 carries a chain sprocket 28 fixedly attached thereto. A moving chain 29 engages and rotates each sprocket 28 and roller 13–18. Wall 11 includes side dam member 30 extending therealong. End 60 of each support roller 13–18 rotatably extends through an aperture 31 formed through side dam 30. Cylindrical low friction plastic washers 32 and 33 seal the space between each roller 13–18 and walls 11 and 12.

Elongate cylindrical lower fluid containment rollers 20–24 are interposed between and continuously contact and rotate on top of and intermediate the outer cylindrical surfaces 13A–18A of each adjacent pair of support rollers 13–18. For instance, lower fluid containment roller 20 is interposed between surfaces 13A and 14A of roller pair 13, 14. Fluid containment rollers 20–24 are rotated in the direction of arrows C by support rollers 13–18. Each fluid containment roller 20–24 is presently of a diameter slightly less than that which would cause the roller to protrude above a generally horizontal imaginary plane passing through substrate strip 25, and has a length less than the distance D between side wall 12 and side dam member 30. Each roller 20–24 substantially seals the cylindrical outer surfaces of an adjacent support roller 13–18 pair while generally not impeding the free rotation of the roller pair. Upper fluid containment rollers 35 and 36 are parallel to one another and are positioned above end rollers 13 and 18. Ends 37 and 38 of rollers 35 and 36 are each rotatably mounted in one of side walls 11 and 12. Cylindrical low friction plastic washers 53 and 54 seal the spaces between each roller 35, 36 and walls 11 and 12. End 37 of roller 35 extends into a vertical slot 26 receiving end 19 of roller 13. End 38 of roller 35 extends into a vertical slot 27 receiving end 20 of roller 13. The diameter of ends 37 and 38 is presently generally equivalent to the diameter of ends 19 and 60 of rollers 13–18. End 38 of roller 35 rotatably passes through an aperture formed through side dam member 30 in the same manner as end 38 on roller 36 does through aperture 39 in FIG. 2. The portions of each end 19, 60, 37 and 38 in a slot 26, 27 includes a bushing 40 secured thereto. End 37 of roller 36 extends into vertical slot 26 which receives end 19 of roller 18. End 38 of roller 36 extends into vertical slot 27 which receives end 60 of roller 18. End 38 of roller 36 rotatably extends through an aperture 39 formed in side dam 30. Rollers 35 and 36 contact rollers 13 and 18 or contact strip 25 passing over rollers 13 and 18. Motive power is transmitted from rollers 13 and 18 to rollers 35, 36 and causes rollers 35, 36 to turn in the direction indicated by arrow E.

Spaced apart disks 41 are fixedly attached to shaft 42. The ends of shaft 42 rotatably extend into vertical slots 26 and 27 which rotatably receive ends 19 and 60 of roller 16. The end of rod 42 extending into a slot 27 also rotatably passes through an aperture formed through side dam member 30 in the same manner aperture 39 is formed through member 30 for end 38 of roller 36. Disks 41 on shaft 42 contact the outer surface 16A of roller 16 or contact strip 25 traveling over roller 16. Motive power is transmitted from roller 16 to friction wheel 54 at the end of shaft 42 carrying disks 41 and causes disks 41 and shaft 42 to turn in the direction indicated by arrow E. Disks 41 prevent a strip of material 25 passing through the apparatus of FIGS. 1 and 2 from floating upwardly away from the uppermost portions of support rollers 13–18. The uppermost portions of rollers 13–18 lie in and define a horizontally oriented imaginary plane. In FIG. 1, strip of material 25 lies in this imaginary plane. The imaginary plane is, in FIG. 1, perpendicular to the plane of the paper of the drawings. Since lower fluid containment rollers 20–24 rotate in a direction which would cause rollers 20–24 to oppose the movement of strip 25 in the direction of arrow A, the diameter of rollers 20–24 is preferably small enough so that rollers 20–24 are each positioned beneath the imaginary plane intersecting the uppermost portions of rollers 13–18.

Fluid in reservoir 43 generally is above support rollers 13–18 and lower fluid containment rollers 20–24, is between upper fluid containment rollers 35 and 36, and extends above the imaginary plane extending through the uppermost portions of rollers 13–18.

During operation of the apparatus of FIGS. 1 and 2, fluid from reservoir 43 seeps between lower fluid containment rollers 20–24 and support rollers 13–18, and between upper fluid containment rollers 35 and 36 and rollers 13 and 18. Additional fluid 45 is introduced into reservoir 43 through at least one conduit member 44 having at least one nozzle mouth 46 or 47 positioned beneath the surface of reservoir 43. Fluid flows from nozzle mouth 46 or 47 in the directions of travel indicated by arrows F and G. The directions of flow F and G of fluid 45 into reservoir 43 are generally parallel to the imaginary plane intersecting the uppermost portions of rollers 13–18, are generally parallel to the planar surface of strip 25, and are generally parallel to the direction of travel A of strip 25 through the apparatus. Consequently, the introduction of fluid 45 into reservoir 43 in the direction of arrows F and G promotes the uniform laminar flow of fluid over the upper surface of strip 25. Nozzle mouths 46 and 47 are presently preferably positioned above the pass line, i.e., above the upper surface of strip 25. The uniform laminar flow of fluid over the upper surface of strip 25 minimizes the formation of eddy currents in fluid reservoir 43 and therefore facilitates the transport of very thin substrate strips 25, and tends to eliminate "dead" areas of chemical interaction between fluid in reservoir 43 and strip 25. The flow rate of fluid 45 through conduit 44 into reservoir 43 is adjusted to compensate for and generally equal fluid losses from reservoir 43 during operation of the apparatus.

A nozzle mouth 46 or 47 can also, if desired, be positioned above the surface of reservoir 43. Mouth 46 can, regardless of the position of mouth 46 above or beneath the surface of reservoir 43, be shaped and dimensioned such that fluid flowing through mouth 46 travels radially outwardly away from nozzle 44 in any selected direction(s) of travel. Further, while the direction of travel of fluid emitted from mouth 46 and flowing away from nozzle 44 is presently preferably parallel to the imaginary plane lying in material 25 passing beneath nozzle 44, mouth 46 can also be shaped and dimensioned such that fluid emitted by mouth 46 flows upwardly away from and/or downwardly toward material 25.

The apparatus of the invention permits the use of solutions in reservoir 43 which contain a high quantity of surfactants. Solutions with a high quantity of surfactants are generally not suitable for use in spray treatment apparatus.

Side walls 11 are connected to a base 50 and end walls 51 and 52. Any suitable source of motive power can be utilized to drive chain 29.

Ends 37, 38 of rollers 35 and 36 and the ends of shaft 42 "float" in their respective slots 26 and 27 and can be readily slidably displaced upwardly away from and then downwardly toward their respective support rollers in the directions indicated by arrows H. This permits rollers 35 and 36 and disks 44 to be upwardly displaced away from their respective operatively associated support rollers when a strip of material 25 is fed through the apparatus.

Having described my invention in such terms as to enable those skilled in the art to understand and practice it, and having identified the presently preferred embodiments thereof, I claim:

1. A dynamic flood conveyor for processing the upper surface of a piece of material, including
   (a) a pair of upstanding spaced apart side walls;
   (b) generally horizontally oriented adjacent parallel support rollers for supporting and transporting said piece of material, said support rollers including first and second end rollers and a third roller intermediate said end rollers and
      (i) spanning the space between said side walls,
      (ii) having first and second ends each rotatably mounted in one of said walls, and
      (iii) having a cylindrical outer surface spanning the space between said side walls,
   the uppermost portion of said cylindrical surfaces of said rollers each generally lying in and defining a common generally horizontal imaginary plane;
   (c) means for rotating each of said support rollers in a common direction;
   (d) a plurality of lower fluid containment rollers each
      (i) sealingly interposed between, continuously contacting and rotating on top of and intermediate said cylindrical surfaces of an adjacent pair of said support rollers, and
      (ii) rotating in a direction opposite said common direction of rotation of said support rollers;
   (e) a pair of upper fluid containment rollers each
      (i) spanning the space between side walls,
      (ii) having a pair of ends each rotatably mounted in one of said side walls, and
      (iii) positioned above and generally parallel to one of said first and second end rollers and continuously contacting at least one of a first contact pair, said contact pair comprising
         said cylindrical outer surface of one of said end rollers, and
         the upper surface of a piece of material passing between said upper fluid containment roller and said one of said end support rollers;
   (f) washer means sealingly interposed between said ends of each of said support and fluid containment rollers and one of said side surfaces;
   (g) a reservoir of fluid in said flood conveyor, said fluid reservoir generally
      (i) being above said support rollers and said lower fluid containment rollers,
      (ii) being between said upper fluid containment rollers, and
      (iii) extending above said imaginary plane;
   (h) at least one disk
      (i) spaced apart from said side walls,
      (ii) positioned above said third roller and continuously contacting and rotating over a portion of one of a second contact pair, said second contact pair comprising
         said cylindrical outer surface of said third roller, and
         the upper surface of a piece of material passing between and simultaneously contacting said upper disk and said third support roller,
      said disk preventing a piece of material passing between said disk and third roller from upwardly rising away from contact with said third roller and, for a piece of material passing between said disk and third roller, exposing to fluid in the reservoir the upper surface of the portion of the piece of material contacting said third roller and not contacting said disk; and (i) nozzle means positioned beneath the surface of said fluid reservoir above said imaginary plane and intermediate said fluid containment rollers and said side walls to inject fluid into said reservoir in a direction of travel generally parallel to said imaginary plane, and outwardly from said nozzle means toward at least one of the group consisting of said side walls and said containment rollers, said nozzle means injecting fluid into said reservoir at a rate generally equivalent to fluid losses from said reservoir between said lower fluid containment rollers and said support rollers and between said upper fluid containment rollers.

* * * * *